United States Patent
Takahashi et al.

(10) Patent No.: US 6,410,966 B2
(45) Date of Patent: Jun. 25, 2002

(54) RATIO CIRCUIT

(75) Inventors: Hiroshi Takahashi, Ohi; Yutaka Toyonoh, Tokyo; Yasumasa Ikezaki, Matsudo; Tohru Urasaki, Yokohama; Akihiro Takegama, Tokyo, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/880,205

(22) Filed: Jun. 13, 2001

Related U.S. Application Data

(62) Division of application No. 09/532,254, filed on Mar. 22, 2000.

(51) Int. Cl.[7] .......................... H01L 29/76; H01L 29/94; H01L 31/062; H01L 31/113; H01L 31/119
(52) U.S. Cl. ......................................... 257/368; 257/393
(58) Field of Search .................................. 257/368, 393, 257/903, 904, 206

(56) References Cited

U.S. PATENT DOCUMENTS

| | | |
|---|---|---|
| 4,464,587 A | 8/1984 | Suzuki et al. |
| 4,700,089 A | 10/1987 | Fujii et al. |
| 4,820,939 A | 4/1989 | Sowell et al. |
| 5,175,445 A | 12/1992 | Kinugasa et al. |
| 5,404,030 A * | 4/1995 | Kim et al. ................... 257/369 |
| 5,463,340 A | 10/1995 | Takabatake et al. |
| 5,568,429 A | 10/1996 | D'Souza et al. |
| 5,612,632 A | 3/1997 | Mahant-Shetti et al. |
| 5,945,859 A | 8/1999 | Pang |

* cited by examiner

*Primary Examiner*—Sara Crane
*Assistant Examiner*—Thien F Tran
(74) *Attorney, Agent, or Firm*—Bret J. Petersen; Frederick J. Telecky, Jr.

(57) ABSTRACT

The purpose of this invention is to ensure an active use of the inverse short-channel effect in the ratio circuit and to guarantee stable operation at low power source voltage. In this ratio circuit, N-channel MOS transistor 12 of CMOS circuit 10 on one side forms the drive element, while P-channel MOS transistor 18 of CMOS circuit 16 on the other side forms the load element. Said N-channel MOS transistor 12 on the drive side and P-channel MOS transistor 16 on the load side have their drain terminals electrically connected to each other through transfer gate 22 made of N-channel MOS transistor. MOS transistor 12 on the drive side has a single channel CHa with the inverse short-channel effect. MOS transistor 18 on the load side has plural, e.g., two, channels CHb1 and CHb2, connected in tandem, each of which displays the inverse short-channel effect.

6 Claims, 11 Drawing Sheets

RATIO CIRCUIT

This is a division of application Ser. No. 09/532,254, filed Mar. 22, 2000.

FIELD OF THE INVENTION

This invention pertains to a ratio circuit, and in particular a MOS transistor ratio circuit for a latch and other digital circuits utilizing a ratio circuit.

BACKGROUND OF THE INVENTION

As illustrated by curve LA in FIG. 14, MOSFETS (metal-oxide semiconductor field-effect transistors) and other MOS devices exhibit the so-called short-channel effect, which is a phenomenon in which the threshold voltage $V_{th}$ decreases with the length of the channel or gate. When the short-channel effect is pronounced, punch-through takes place, so that the current between the source and drain cannot be controlled by the gate voltage. Consequently, in order to ensure normal functioning of MOS transistors, it is necessary to prevent the short-channel effect and punch-through.

Various technologies have been developed or proposed to suppress the short-channel effect. For example, a recent processing technology that uses a gate length of 0.21 μm as the design rule adopts the LDD (lightly doped drain) structure shown in FIG. 15. In this structure, below the low-concentration diffusion region (N⁻) on the channel side end portion of the drain and source regions, the opposite conductivity type low-concentration diffusion region (P⁻) is formed by means of impurity ion implantation at a prescribed angle of incidence [θ]. In this way, expansion from the drain and source regions to the depletion region can be effectively suppressed. Curve LB in FIG. 14 shows a profile with maximum threshold voltage $V_{th}$ near the minimum gate length (0.21 μm) to satisfy the design rule. That is, the so-called inverse short-channel effect is realized.

The example shown in FIG. 15 pertains to an N-channel MOS transistor. However, the same technology applies to the P-channel MOS transistor. In FIG. 14, characteristic curves LA and LB refer to the results of simulation and experiment for the N-channel MOS transistor, respectively. The same characteristic curves can be obtained with the P-channel MOS transistor. However, in this case, the rate of increase of $V_{th}$ in the inverse short-channel effect is a little smaller (lower).

FIG. 16 is a diagram illustrating an example of the conventional CMOS ratio circuit having the aforementioned MOS transistors with the inverse short-channel effect. In this ratio circuit, N-channel MOS transistor 202 of CMOS (complementary metal oxide semiconductor) circuit 200 forms the driving element, while P-channel MOS transistor 206 of CMOS circuit 204 on the other side forms the load element. The drain terminals of said N-channel MOS transistor 202 on the driving side and said P-channel MOS transistor 206 on the load side are electrically connected via transfer gate 208. Usually, node 210 between said two transistors 202 and 206 is connected as the output terminal of this ratio circuit to the other circuit (not shown in the FIG.).

When both MOS transistors 202 on the driving side and MOS transistor 206 on the load side are on, transfer gate 208 is on. In this state, current i has the following circuit path: power source terminal of power source voltage Vdd→P-channel MOS transistor 206 on the load side →transfer gate 208→N-channel MOS transistor 202 on the driving side→ground terminal.

In this ratio circuit, the conductance of MOS transistor 202 on the drive side is made higher than that of MOS transistor 206 on the load side. In this way, when both transistors are on, they are electrically mismatched, so that the output voltage at node 210 shifts toward the reference voltage (ground potential) on the side of MOS transistor 200.

FIG. 17 illustrates the layout of two MOS transistors 202 and 206. For MOS transistor 202 on the driving side, in order to raise the operating speed to the maximum, the gate length Li is set as the minimum gate length dimension (e.g., 0.21 μm) of the design rule, and, in order to increase the current capacity, the channel width Wi is selected to have a relatively large dimension (e.g., 0.91 μm). On the other hand, for MOS transistor 206 on the load side, in order to realize a load function with a high ON-resistance (a low conductance), the gate length Lj is selected to a dimension (e.g., 0.35 μm) significantly larger than the minimum gate length dimension. Also, channel width Wj is selected to have a dimension (e.g., 0.56 μm) smaller than that on the driving side.

In this way, since MOS transistor 202 on the driving side has gate length Li of the minimum gate length dimension of the design rule, operation is performed at a high threshold voltage Vth due to the inverse short-channel effect. On the other hand, for MOS transistor 206 on the load side, since the gate length Lj is significantly larger than the minimum gate length dimension of the design rule, operation is performed at a relatively low threshold voltage Vth without the influence of the inverse short-channel effect (also without the influence of the short-channel effect).

In recent years, with the progress made in realizing higher levels of integration and higher density of semiconductor ICs, in consideration of the reduction of power consumption, there has been a demand for the operation of various types of electronic equipment at lower power source voltage. In particular, there has been an increasing demand for guaranteeing the operation of portable battery-powered electronic equipment even when the power source voltage drops below 1 V.

The present inventors have extensively studied the performance and operation of the ratio circuit and found that in the conventional design method, due to influence of the inverse short-channel effect, there is an operating limit near 0.95 V. However, assuming a nominal voltage of 1.0 V, since there should be certain tolerance (margin), operation should be guaranteed down to 0.9 V, that is, 10% below the nominal voltage. Consequently, an operating limit near 0.95 V is insufficient.

Also, since the threshold voltage Vth of the MOS transistor rises as the temperature decreases, the influence of the inverse short-channel effect becomes stronger at low temperatures, and the operating limit value may become even higher.

FIGS. 18, 19 and 20 respectively illustrate $I_D$-$V_{GS}$ characteristic curves for three models of "WEAK," "NOMINAL," and "STRONG" obtained in the SPICE simulation in the case of the design of MOS transistors with channel width W selected as 0.21 (constant) and gate length L selected as 0.21 μm and 0.35 μm (two types) at ambient temperature of −40° C. For example, as can be seen from FIG. 18, threshold voltage Vth that corresponds to a given characteristic curve can be assumed to be the voltage value at the intersection of the straight line drawn tangent to the linear portion of the characteristic curve and the voltage axis.

Variations in the fabrication process lead to variations in device characteristics. In this example, the WEAK model refers to the fact that threshold voltage $V_{th}$ is relatively high and the current driving ability is relatively low (weak). On the other hand, the STRONG model refers to the case when threshold voltage Vth is relatively low and the current driving ability is relatively high (strong). The NOMINAL model refers to the intermediate case between the two aforementioned models. Also, for general-purpose conventional products, the Ta specification is 0 to 70° C. On the other hand, for communication ICs, it is in the range of −40° C. to 85° C. Consequently, −40° C. can be regarded as the worst-case temperature at which operation can be assured.

As can be seen from FIGS. 18, 19 and 20, when the power source voltage (nearly equal to gate-source voltage $V_{GS}$) of a MOS transistor with a gate length of 0.21 μm falls close to 0.9 V, the transistor will be operating in the sub-threshold region since the threshold voltage $V_{th}$ will have been raised by the inverse short-channel effect. In this sub-threshold region, since the S-factor is about 80 mV/dec, even a decrease in the voltage of 0.08 V leads to a decrease in the leakage current by one order of magnitude. Consequently, the operation is governed by the sub-threshold current instead of the original driving current.

On the other hand, even at a low power source voltage of about 0.9 V, a MOS transistor with a gate length of 0.35 μm will be able to maintain operation essentially in the linear region since there is no influence of the inverse short-channel effect (there is also no influence of the short-channel effect), and threshold voltage $V_{th}$ is relatively low (about 0.76 V).

Consequently, in the conventional ratio circuit, MOS transistor 202 on the drive side operating in the sub-threshold region and MOS transistor 206 on the load side operating in the linear region are electrically mismatched and the desired operation, that is, the operation with the potential of node 210 between them shifting toward the reference potential on the driving side cannot be guaranteed. That is, a design in which the operation is determined on the basis of the conductance or the ON-resistance cannot be established.

In order to solve the aforementioned problem, it has been proposed that the current-driving ability of MOS transistor 202 on the drive side at a low power source voltage should be raised, and its channel width W should be further increased. However, when a decrease in the current-driving ability of the S-factor is compensated for, channel width W becomes so large that it is unrealistic with respect to the layout.

Also, at present, the specifications are for adopting a low power source voltage of 1 V or less and a conventional power source voltage of, e.g., 1.8 V, at the same time. Consequently, not only the operation should be guaranteed under the low power source voltage, but also the performance of operation under the conventional power source voltage should not degrade. Also, for MOS transistor 202 on the driving side, if channel width W is increased significantly, the gate capacitance rises, leading to a deterioration in the performance (power consumption, speed, etc.) in the mode of operation under the conventional power source voltage.

Also, in consideration of the design database and the cell library, it is inconvenient to prepare and use two types, one for operation at conventional voltage and the other for operation at low voltage.

The purpose of this invention is to solve the aforementioned problems of the conventional technology by providing a type of ratio circuit and a type of latch circuit with improvement in guaranteeing the operation at low power source voltage.

Another purpose of this invention is to provide a ratio circuit and a latch circuit which make active use of the inverse short-channel effect to guarantee stable operation at low power source voltage.

Yet another purpose of this invention is to provide a ratio circuit and a latch circuit which can guarantee stable operation over a wide range of power source voltages, including 1 V or less.

Yet another purpose of this invention is to provide a ratio circuit and a latch circuit which can guarantee stable operation at low power source voltage without substantially increasing the surface area of the circuit.

Yet another purpose of this invention is to provide a MOS transistor which can guarantee a high ON-resistance and operates under the influence of the inverse short-channel effect without substantially increasing the surface area of the circuit.

SUMMARY OF THE INVENTION

In order to realize the aforementioned purpose, the ratio circuit of this invention has a configuration in which a first MOS transistor having a single channel with inverse short-channel effect and a second MOS transistor having plural channels each having inverse short-channel effect and connected in tandem are electrically connected to each other.

In the ratio circuit of this invention, if both the first and second MOS transistors with inverse short-channel effect are conducting, they will be electrically mismatched. Since the two MOS transistors have similar threshold voltages, at a low power source voltage near the threshold voltage, both MOS transistors will operate in the sub-threshold region. In this case, due to a difference in the number of channels connected in tandem between the two MOS transistors, the second MOS transistor operates at a higher ON-resistance. Consequently, the current driving ability of the first MOS transistor predominates, and the potential of the node between the two MOS transistors shifts toward the potential of the first MOS transistor.

In the ratio circuit of this invention, the first and second MOS transistors may either P-channel conductivity type or N-channel conductivity type. Also, for the two MOS transistors, the terminals connected to each other and the terminals on the opposite side may be connected to any power source voltage terminal or other element or circuit, and it is possible to apply any signal or voltage to each gate terminal.

A typical form of the ratio circuit of this invention has a first MOS transistor of the first conductivity type which has a single channel with inverse short-channel effect and which has its source terminal connected to a first reference voltage terminal that feeds the first potential, and a second MOS transistor of the second conductivity type which has plural channels each having the inverse short-channel effect and connected in tandem, and which has its source terminal connected to a second reference voltage terminal that feeds a second potential different from said first potential and has its drain terminal electrically connected to the drain terminal of said first MOS transistor.

In the latch circuit of this invention, the first MOS transistor forms the driving element, while the second MOS transistor forms the load element. When the latch circuit of this invention is CMOS, it also has a third MOS transistor of the second conductivity type which has its source terminal connected to said second reference voltage terminal and has its drain terminal connected to the drain terminal of said first MOS transistor, with the gate terminal supplied with the same gate voltage as for the gate terminal of said first MOS transistor, and a fourth MOS transistor of the first conductivity type which has its source terminal connected to said first reference voltage terminal and has its drain terminal connected to the drain terminal of said second MOS transistor, with the gate terminal supplied with the same gate voltage as for the gate terminal of said second MOS transistor.

In this CMOS form, said third MOS transistor has a single channel with inverse short-channel effect, and said fourth MOS transistor has plural channels each having inverse short-channel effect and connected in tandem. For said third and fourth MOS transistors, the former acts as a driving element, while the latter acts as a load element.

For the MOS transistor of this invention, the intermediate regions multiply divide the channel between the source region and drain region, and the divided channels are connected in tandem, with each divided channel displaying the inverse short-channel effect.

In order to realize the inverse short-channel effect for each divided channel, the prescribed semiconductor region is formed on a principal surface of the semiconductor substrate or semiconductor layer between the source region and the intermediate region and between the drain region and the intermediate region.

The semiconductor region acts to relax the electric field near the ends of the source region, intermediate region and drain region facing the dividing channels, and to inhibit the extension of the depletion layer. For example, the semiconductor region may have a first region of the second conductivity type, which has a different impurity concentration than said source region, said drain region and said intermediate region and which is placed in contact with said insulating film, and a second region, which has a different impurity concentration than said semiconductor substrate or semiconductor layer and which is formed beneath it in contact with said first region.

Figure 1:
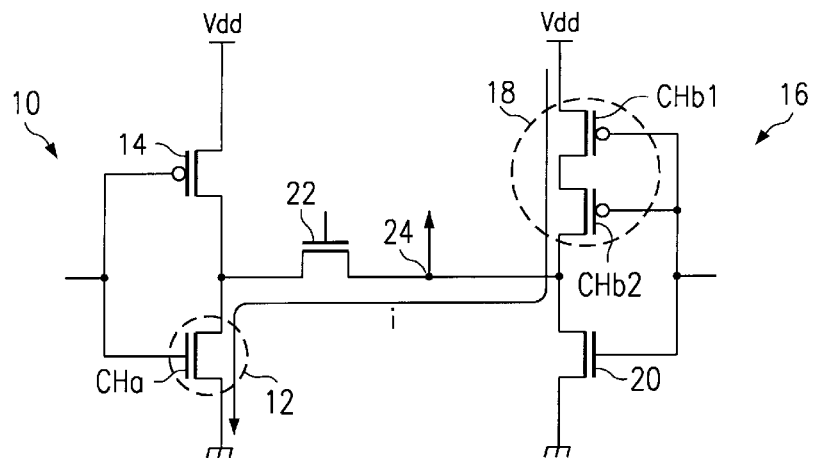
FIG. 1 is a circuit diagram illustrating the circuit configuration of the ratio circuit in an embodiment of this invention.

REFERENCE NUMERALS AND SYMBOLS AS SHOWN IN THE DRAWINGS 10, 16 CMOS circuits, 12 N-channel MOS transistor on the driving side, 18 P-channel MOS transistor on the load side, 22 Transfer gate, 30 P-type silicon substrate, 32 n-Type well, 34 Source region, 36 Intermediate region, 38 Drain region, 40 Gate oxide film, 42(1), 42(2) Gate electrodes, 74 P-channel MOS transistor on the driving side, 78 N-channel MOS transistor on the load side, 82 N-channel MOS transistor on the load side, 118, 138 N-channel MOS transistors on the driving side, 120, 122 Transfer gates, 128, 132 Load-side P-channel MOS transistors, 154 P-channel MOS transistor on the driving side, 156 N-channel MOS transistor on the driving side, 160 P-channel MOS transistor on the load side 162 N-channel MOS transistor on the load side, 164 CMOS transfer gate,

DESCRIPTION OF THE EMBODIMENTS

In the following, this invention will be explained in more detail with reference to embodiments illustrated by FIGS. 1–3.

FIG. 1 is a diagram illustrating the circuit configuration of the CMOS type ratio circuit in an embodiment of this invention. In this ratio circuit, the N-channel MOS transistor 12 of CMOS circuit 10 on one side forms the driving element, while P-channel MOS transistor 18 of CMOS circuit 16 on the other side forms the load element. The drain terminals of said N-channel MOS transistor 12 on the driving side and P-channel MOS transistor 16 on the load side are electrically connected to each other via transfer gate 22 made of N-channel MOS transistor.

In CMOS circuit 10, the source terminal of N-channel MOS transistor 12 is connected to the terminal at the ground potential, the source terminal of P-channel MOS transistor 14 is connected to the power source voltage terminal at voltage Vdd, and the drain terminal is connected to the drain terminal of N-channel MOS transistor 12. The gate terminals of said MOS transistors 12 and 14 are supplied with the same signal or voltage.

In CMOS circuit 16, the source terminal of P-channel MOS transistor 18 is connected to the power source terminal at power source voltage Vdd, the source terminal of N-channel MOS transistor 20 is connected to the terminal at ground potential, and the drain terminal is connected to the drain terminal of P-channel MOS transistor 18. The gate terminals of said MOS transistors 18 and 20 are supplied with the same signal or voltage.

Node 24 of CMOS circuit 16 may be regarded as the output terminal of the ratio circuit and connected to the other circuit or element (not shown in the FIG.).

In this ratio circuit, MOS transistor 12 on the driving side has single channel CHa that has the inverse short-channel effect. For example, when the recent process technology with the aforementioned gate length of 0.21 µm as the design rule is adopted, the gate length of MOS transistor 12 on the driving side may be selected near the minimum gate length dimension (0.21 µm) of the design rule.

On the other hand, MOS transistor 18 on the load side has plural channels, such as two channels CHb1 and CHb2, which both have the inverse short-channel effect and are connected in tandem-electrically in series. When the aforementioned process technology is adopted, the gate length of MOS transistor 18 on the load side may be selected near the minimum gate length dimension (0.21 µm).

When both MOS transistor 12 on the driving side and MOS transistor 18 on the load side are on, transfer gate 22 is on. In this state, current i flows in the following circuit path: power source terminal of power source voltage Vdd→P-channel MOS transistor 18 on the load side →transfer gate 24→N-channel MOS transistor 12 on the driving side→ground terminal.

For this ratio circuit, as described above, MOS transistor 12 on the driving side has the conventional single channel structure, while N-channel MOS transistor 12 on the load side has a structure of plural or multi-stage channels connected in tandem. Consequently, it is possible to select the ON-resistance of MOS transistor 18 on the load side to be significantly larger than the on-resistance of MOS transistor 12 on the driving side.

In this way, in the case of an electrical mismatch when both MOS transistors 12 and 18 conduct at conventional power source voltage Vdd that is significantly higher than threshold voltage Vth, the potential at node 24 depends on the ratio of the ON-resistance or conductance of the two MOS transistors, and an output voltage shifts toward the reference voltage (ground potential) on the side on MOS transistor 12 on the driving side.

Also, in the case of electrical mismatch when both MOS transistors 12 and 18 are on at a low power source voltage Vdd near threshold voltage Vth, both MOS transistors operate in the sub-threshold region, and the ON-resistance of MOS transistor 18 on the load side is significantly higher than the ON-resistance of MOS transistor 12 on the driving side. Consequently, the current driving ability of MOS transistor 12 on the driving side is much greater than that of MOS transistor 18 on the load side, and the output voltage of node 24 between them shifts toward the reference voltage (ground potential) on the side of MOS transistor 12 on the driving side.

In this way, for this ratio circuit, stable operation can be guaranteed not only at the conventional power source voltage, but also at a low power source voltage near the threshold voltage.

Figure 2:
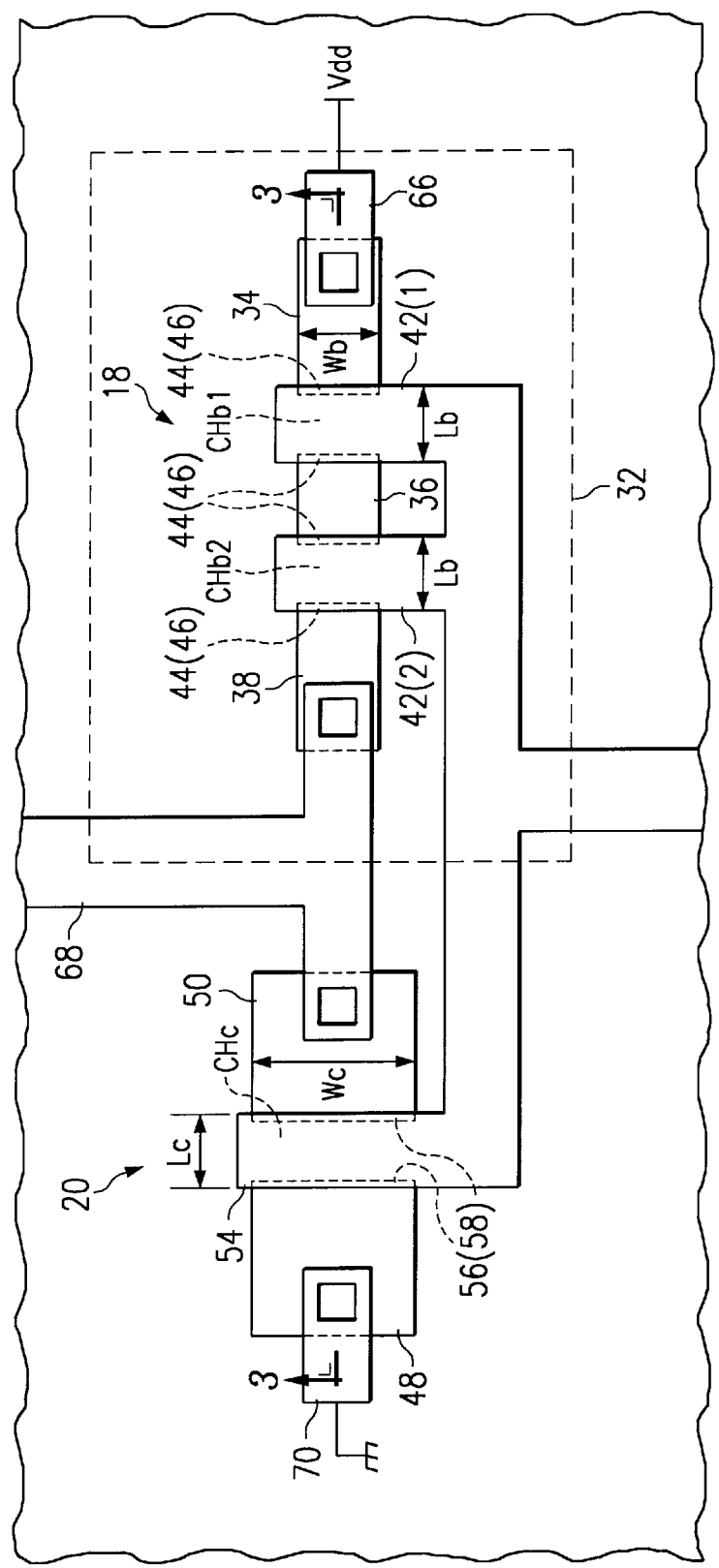
FIG. 2 is a diagram illustrating the layout of the ratio circuit in the embodiment.

FIG. 2 is a diagram illustrating an example of the layout of CMOS circuit 16 including MOS transistor 18 on the load side. FIG. 3 is a cross section along III—III in FIG. 2.

MOS transistor 18 on the load side is formed in n-type well 32 formed on a principal surface of p-type silicon substrate 30. In said MOS transistor 18, $p^+$-type source region 34, intermediate region 36 and drain region 38 are formed by means of a series of impurity diffusion at gap corresponding to gate length Lb or channel length on the principal surface of n-type well 32.

Thin gate oxide film ($SiO_2$) 40 is formed on the principal surface of n-type well 32 between source region 34 and intermediate region 36 and between intermediate region 36 and drain region 38. On said gate oxide film 40, cascade connected gate electrode 42(1) and 42(2) made of, e.g., polysilicon, are formed. In this way, p-type channel CHb1 is formed between source region 34 and intermediate region 36, and p-type channel CHb2 is formed between intermediate region 36 and drain region 38.

Figure 15:
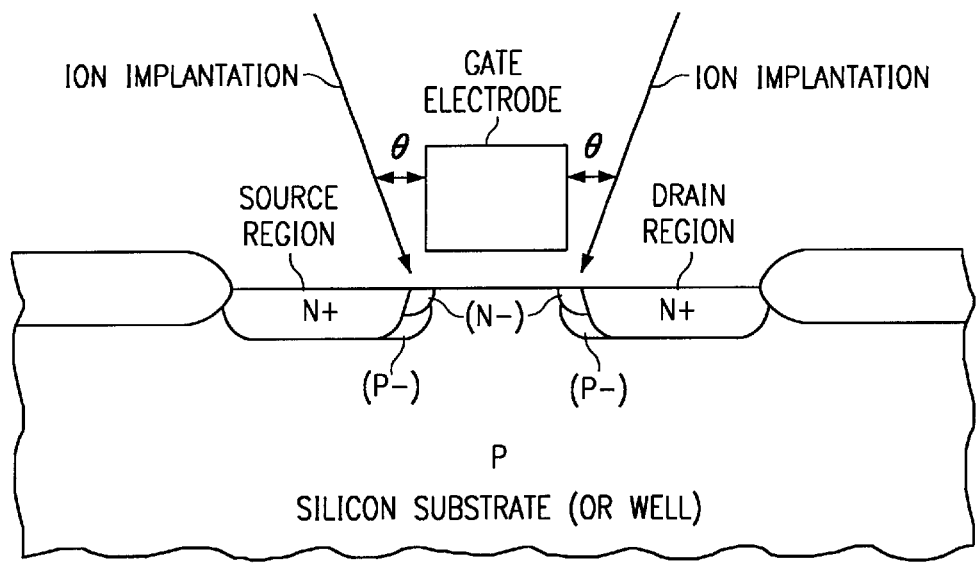
FIG. 15 is a diagram illustrating the structure and process of the MOS transistor for realizing the inverse short-channel effect.
Figure 17:
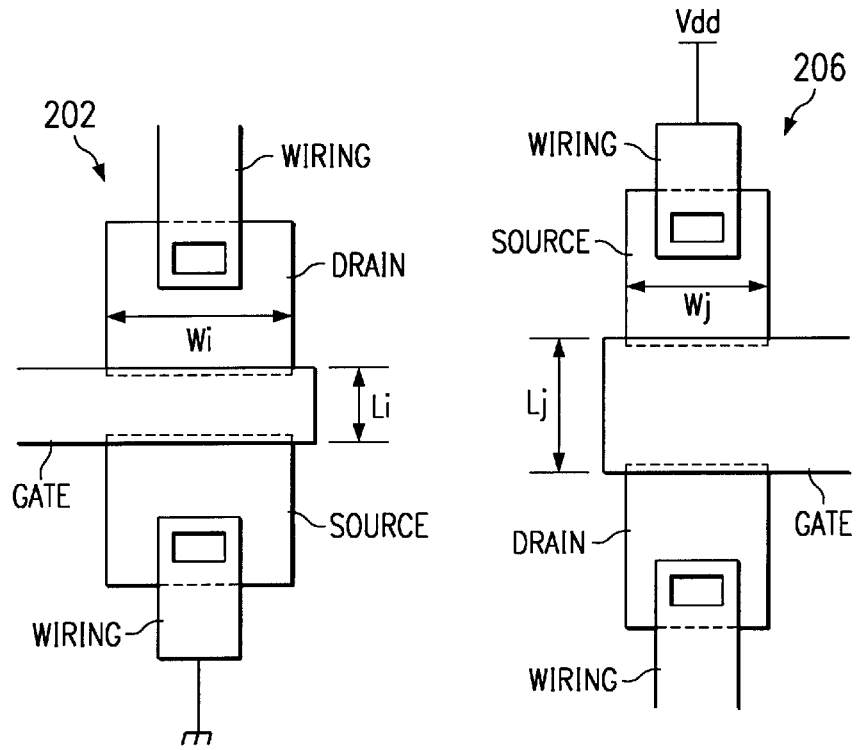
FIG. 17 is a diagram illustrating the layout of the main portion of the ratio circuit shown in FIG. 16.
Figure 18:
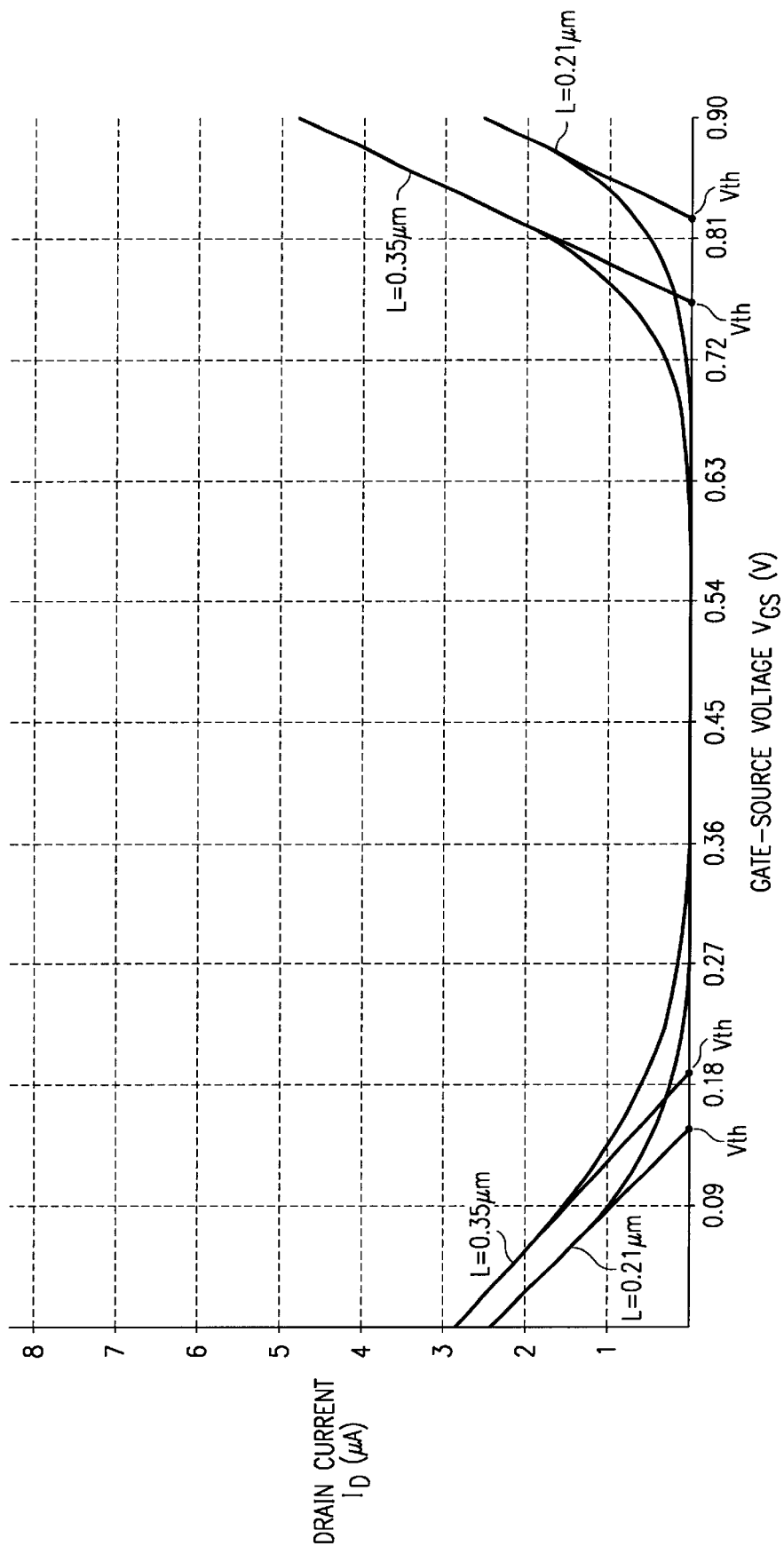
FIG. 18 is a diagram illustrating the $I_D$-$V_{GS}$ characteristics in a simulation model of the MOS transistor.
Figure 19:
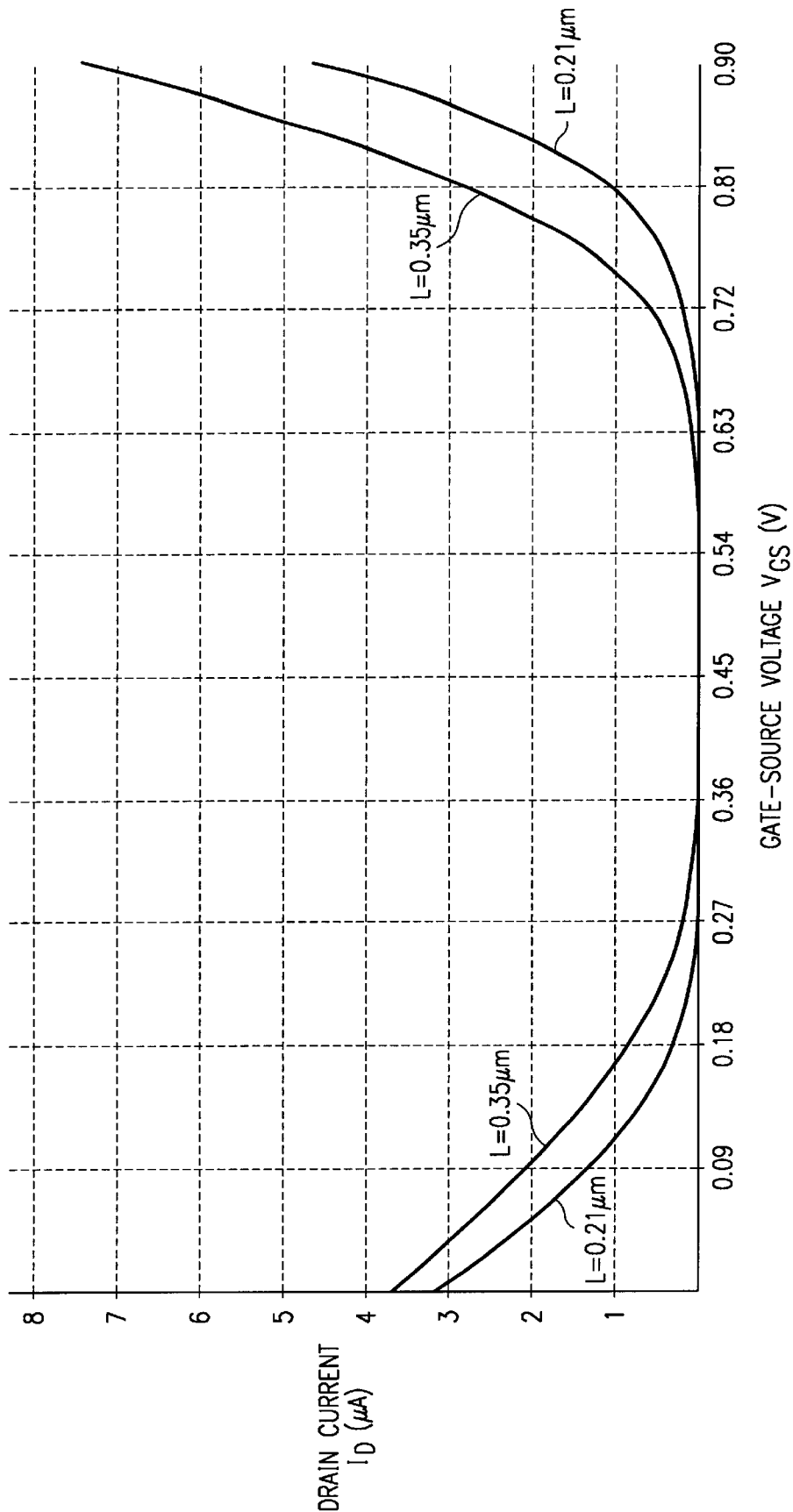
FIG. 19 is a diagram illustrating the $I_D$-$V_{GS}$ characteristics in a simulation model of the MOS transistor.
Figure 20:
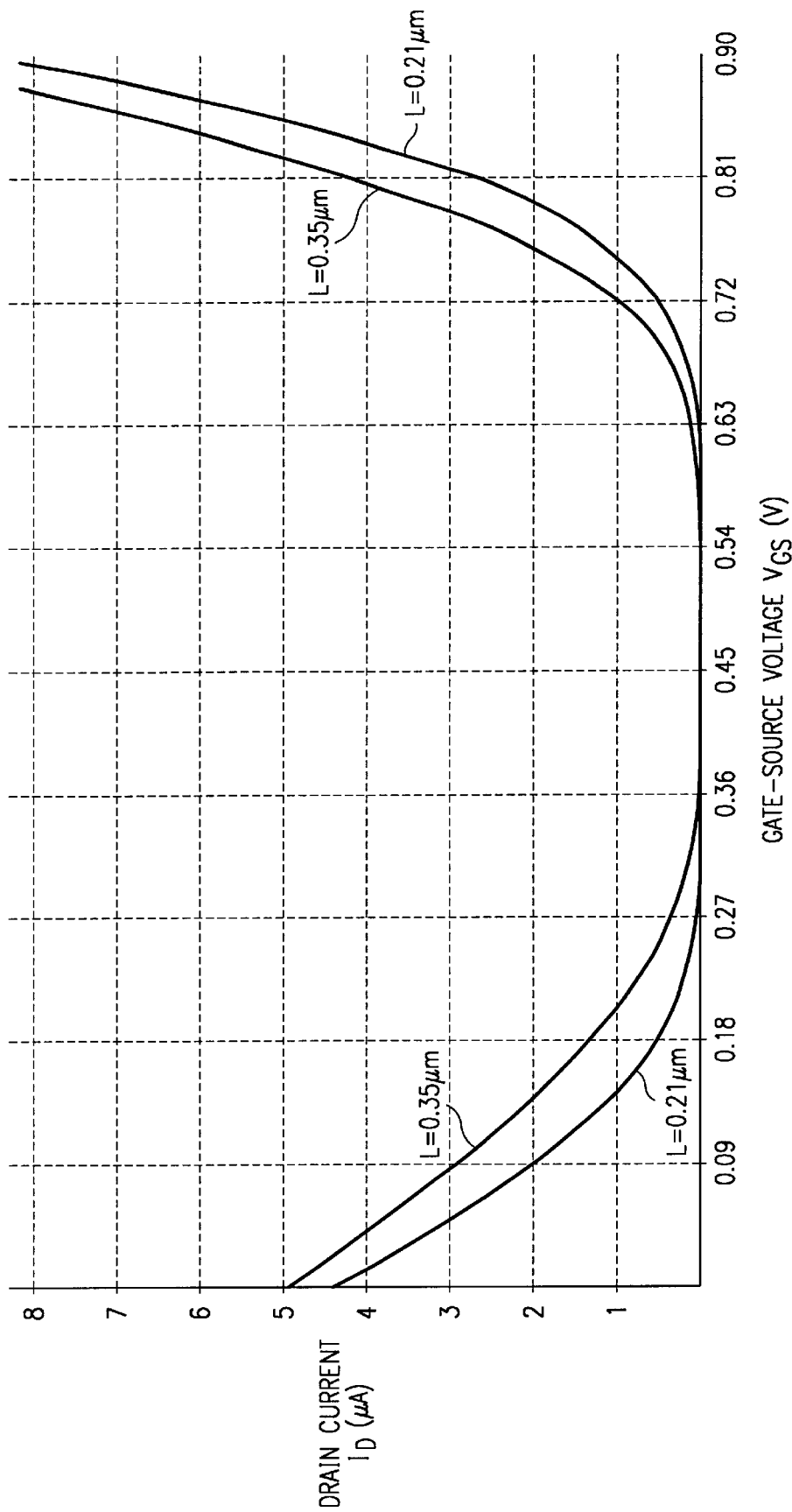
FIG. 20 is a diagram illustrating the $I_D$-$V_{GS}$ characteristics in a simulation model of the MOS transistor.

The various regions of said MOS transistor 18, namely, source region 34, intermediate region 36, and drain region 38, are formed with an LDD structure. Consequently, shallow p-region 44 having low impurity concentration is formed at the end portions of regions 34, 36, 38 near the end portions of gate electrodes 42(1) and 42(2). In order to enhance the inverse short-channel effect, as shown in FIG. 15 ion implantation is performed at a non-orthogonal angle of incidence to form n-region 46, which has a low impurity concentration below said p-region 44.

In the LDD structure, the step of ion implantation at a certain angle of incidence for forming n-region 46 is performed after the ion implanting step for forming p-region 46. After formation of n-region 46, a side wall is formed on gate electrode 42, and the ion implanting operation for forming p-regions 34, 36, 38 is performed.

As explained above, in order to realize the inverse short-channel effect, gate length Lb of said MOS transistor 18 is selected to be near the minimum gate length dimension (0.21 µm) of the design rule. Also, channel width Wb may be significantly smaller than that of the conventional method. For example, it may be about 0.28 µm. Consequently, although there are channels CHb1 and CHb2 connected in tandem, there is no increase in the cell area of MOS transistor 18.

Figure 3:
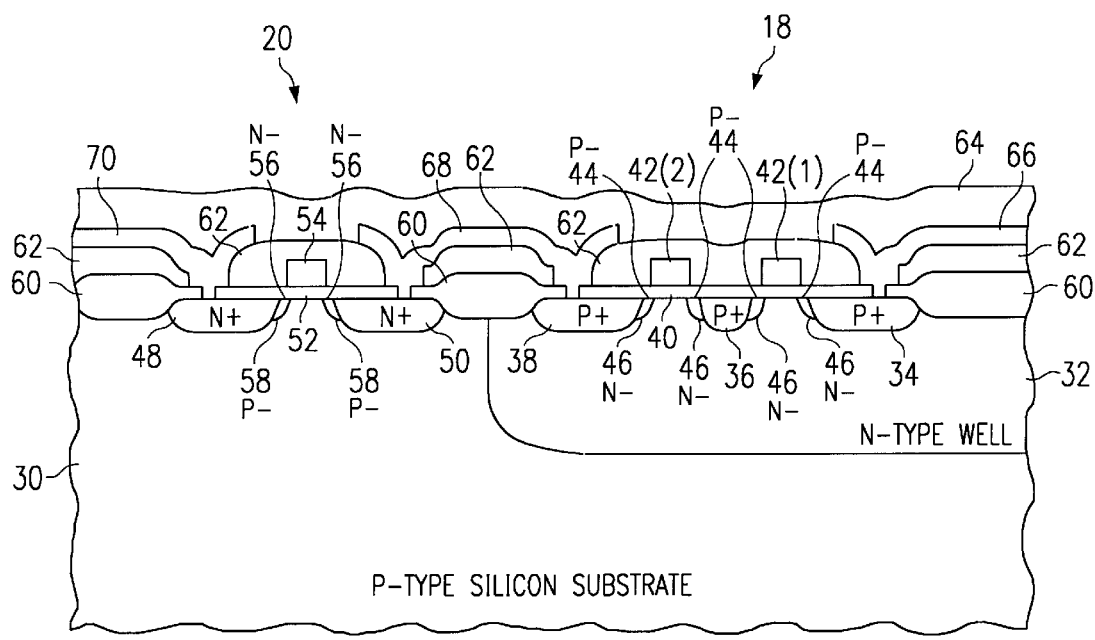
FIG. 3 is a cross section along III—III in FIG. 2, which illustrates the cross-sectional structure of the semiconductor device of the ratio circuit in the embodiment.

In FIGS. 2 and 3, the layout and cross-sectional structure of N-channel MOS transistor 20 are shown, respectively. The same layout and cross-sectional structure may be adopted by N-channel MOS transistor 12 on the driving side.

In N-channel MOS transistor 20, on the principal surface of p-type silicon substrate 30, $n^+$-type source region 48 and drain region 50 are formed with a gap corresponding to gate length Lc or the channel length.

Thin gate oxide film ($SiO_2$) 52 is formed on the principal surface of p-type silicon substrate 30 between source region 48 and drain region 50. On said gate oxide film 52, single gate electrode 54 is formed. In this way, single n-type channel CHc is formed between source region 47 and drain region 50.

In said MOS transistor 20, source region 48 and drain region 50 are formed in the LDD structure. In order to realize the inverse short-channel effect, n-region 56 and p-region 58 are formed in the channel side end portions of regions 48 and 50.

In FIGS. 2 and 3, 60 represents field oxide film ($SiO_2$) for element separation, 62 represents the intermediate insulating film, 64 represents the protective insulating film, and 66, 68 and 70 represent the metal wiring made of, e.g., aluminum.

The ratio circuit shown in FIG. 1 is merely an example. This invention also applies to ratio circuits in various other forms.

Figure 4:
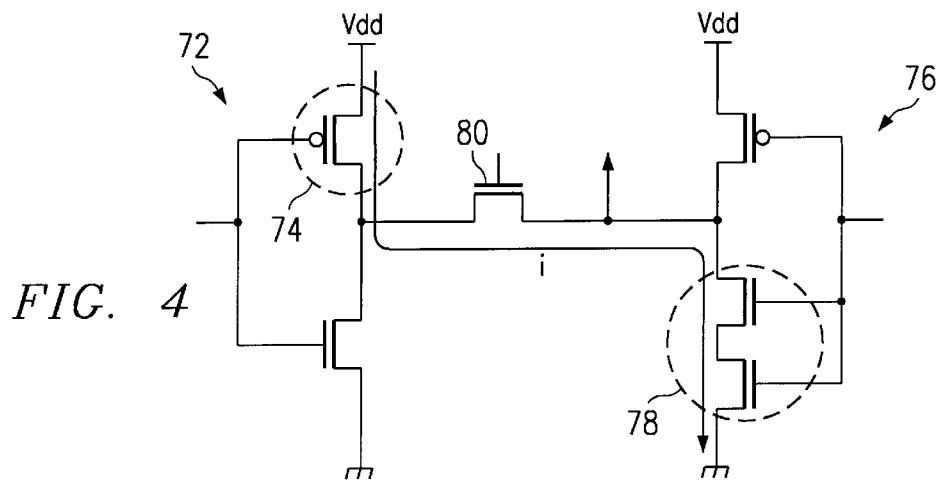
FIG. 4 is a circuit diagram illustrating the configuration of the ratio circuit in another embodiment of this invention.

For example, in the CMOS ratio circuit shown in FIG. 4, P-channel MOS transistor 74 of CMOS circuit 72 on one side forms the driving element, while N-channel MOS transistor 78 of CMOS circuit 76 on the other side forms the load element. N-channel MOS transistor 80 is used as the transfer gate between two CMOS circuits 72 and 76. Also, it is possible to substitute said N-channel MOS transistor 80 by a CMOS transfer gate.

Figure 5:
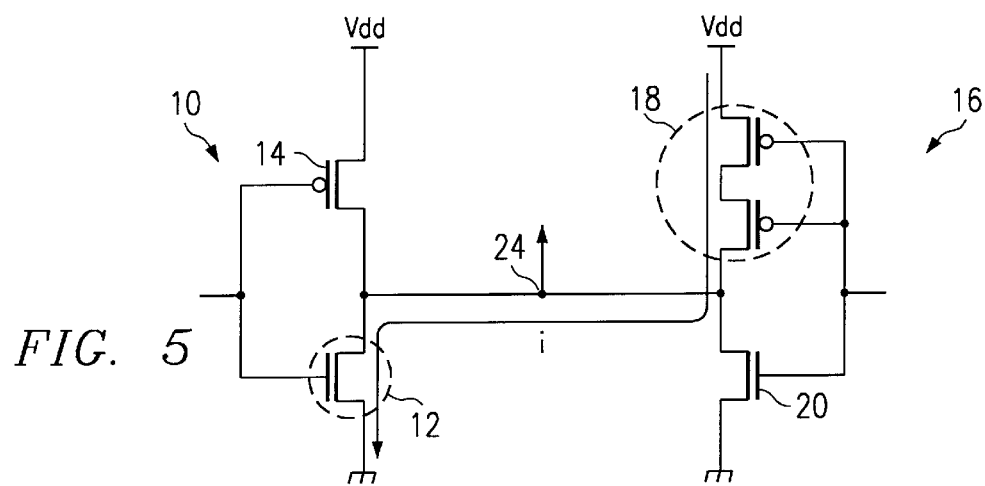
FIG. 5 is a circuit diagram illustrating the circuit configuration of the ratio circuit in yet another embodiment of this invention.

Also, as shown in FIG. 5, it is possible to omit transfer gate 22 in the ratio circuit shown in FIG. 1, and to directly connect MOS transistor 12 on the driving side to MOS transistor 18 on the load side.

Figure 6:
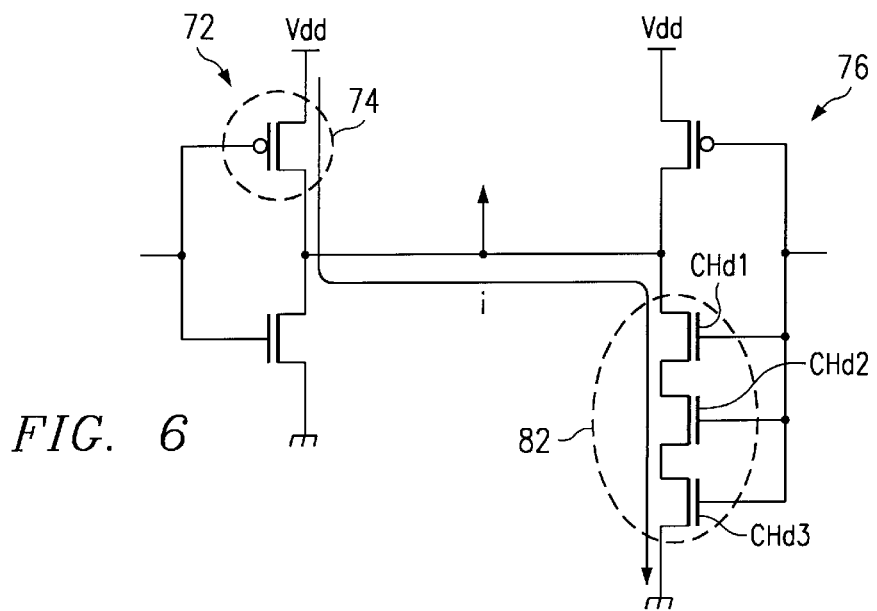
FIG. 6 is a circuit diagram illustrating the circuit configuration of the ratio circuit in yet another embodiment of this invention.
Figure 7:
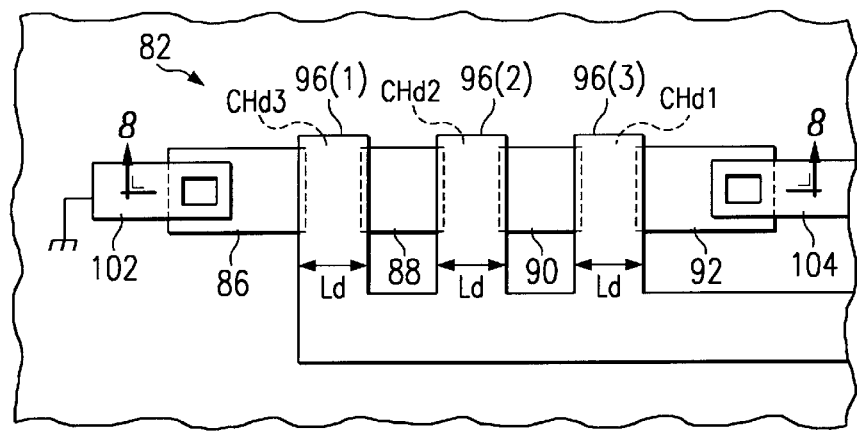
FIG. 7 is a diagram illustrating the layout of the main portion of the ratio circuit shown in FIG. 6.
Figure 8:
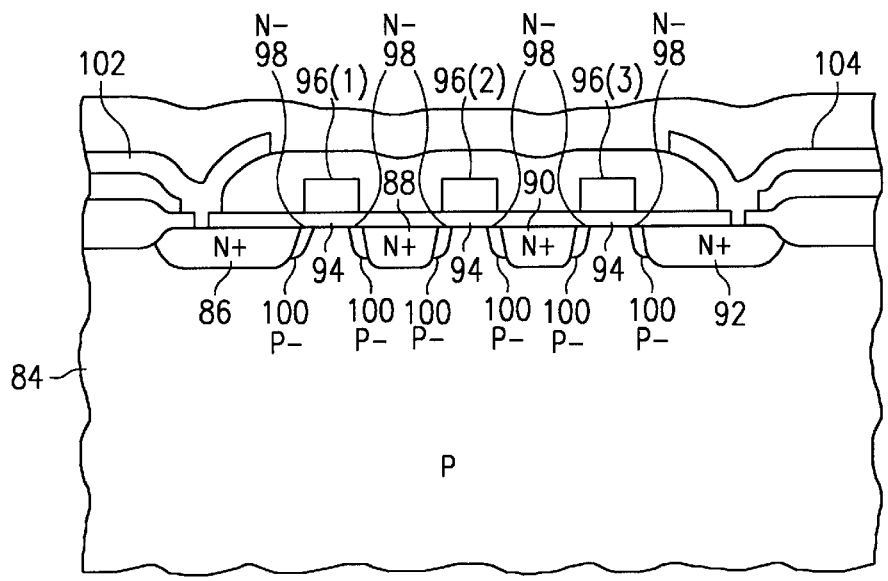
FIG. 8 is a cross section along VIII—VIII in FIG. 7 illustrating the cross sectional structure of the semiconductor device of the main portion of the ratio circuit shown in FIG. 6.

In the example of structure in FIG. 6, N-channel MOS transistor 82 on the load side has three channels, CHd1, CHd2 and CHd3, each displaying the inverse short-channel effect and connected in tandem. FIGS. 7 and 8 illustrate the layout and cross-sectional structure of said MOS transistor 82.

For said MOS transistor 82, $n^+$-type source region 86, intermediate regions 88, 90 and drain region 92 are formed by a series of impurity diffusion regions with a gap corresponding to gate length Ld or the channel length on the principal surface of p-type silicon substrate 84.

Thin gate oxide film 94 is formed on the principal surface of p-type silicon substrate 84 between source region 86 and intermediate region 88, 90 and between intermediate region 90 and drain region 92. On said gate oxide film 94, gate electrodes 96(1), 96(2), 96(3), which are connected in cascade, are formed. In this way, n-type channel CHd3 is formed between source region 86 and intermediate region 88, n-type channel CHd2 is formed between two intermediate regions 88 and 90, and n-type channel CHd1 is formed between intermediate region 90 and drain region 92.

MOS transistor 82 has source region 86, intermediate regions 88, 90 and drain region 92 formed with an LDD structure, and, in order to realize the inverse short-channel effect, n-region 98 and p-region 100 are formed on the channel side end portions of various regions 86, 88, 90, 92.

Also, the ratio circuit of this invention is not limited to the aforementioned CMOS type. It is also possible to make use of independent type N-channel MOS transistor or P-channel MOS transistor as the driving element or load element. It is also possible to form both the driving element and load element from N-channel MOS transistors or P-channel MOS transistors.

In the following, explanation will be made on an embodiment of this invention pertaining to a latch circuit as a typical digital circuit using the ratio circuit.

Figure 9:
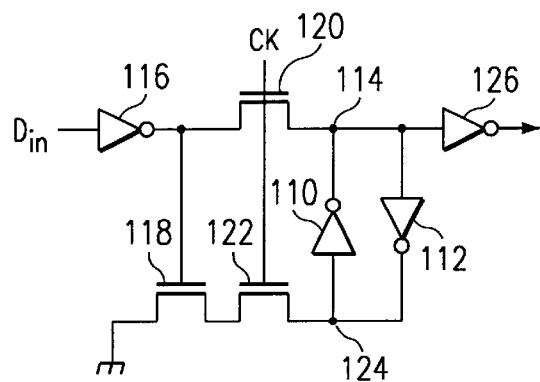
FIG. 9 is a circuit diagram illustrating an example of the latch circuit to which this invention applies.

FIG. 9 is a diagram illustrating an example of the latch circuit to which this invention can be applied. In this latch circuit (corresponding to 1 bit), a pair of inverters 110 and 112 cross-connected to each other (the output and input of one inverter are connected to the input and output of the other inverter, respectively) form a data latch circuit, and data are held in node 114 of the output side of inverter 110.

Inverter 116 of the input state is a driving element for logically inverting 1-bit data input Din and writing it into node 114. More specifically, said inverter 116 is made of CMOS circuit, and N-channel MOS transistor in it acts as a driving element for writing the data of logic value of 0 (L level) in node 114.

In this latch circuit, three N-channel MOS transistors 118, 120 and 122 are set. Among them, N-channel MOS transistor 118 acts a driving element for writing the data of logic value of 0 (L level) in node 124 on the input side of inverter 110 and for writing the data of logic value of 1 (H level) in node 114. N-channel MOS transistors 120 and 122 act as transfer gates, and they perform ON/OFF operation corresponding to the logic level of clock signal CK. Inverter 126 of the output stage acts as an output buffer.

Figure 10:
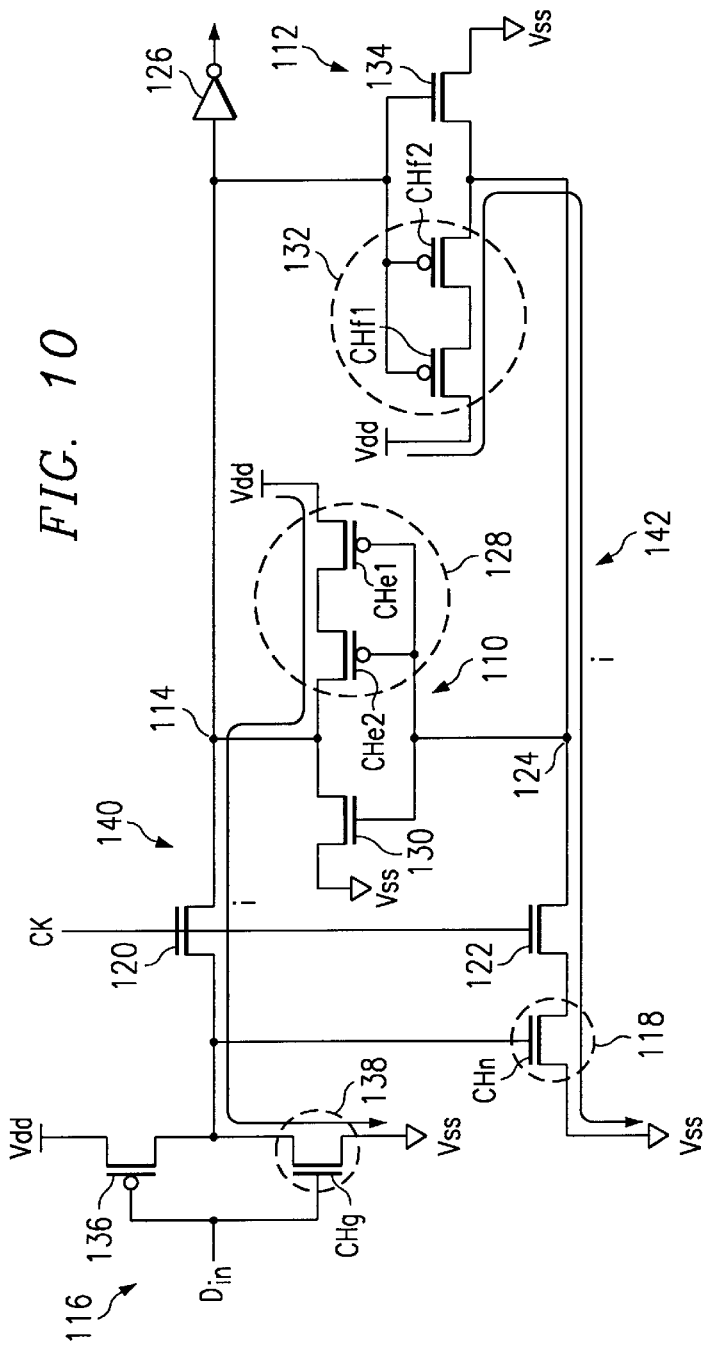
FIG. 10 is a circuit diagram illustrating the circuit configuration of the latch circuit shown in FIG. 9 in an embodiment of this invention.
Figure 16:
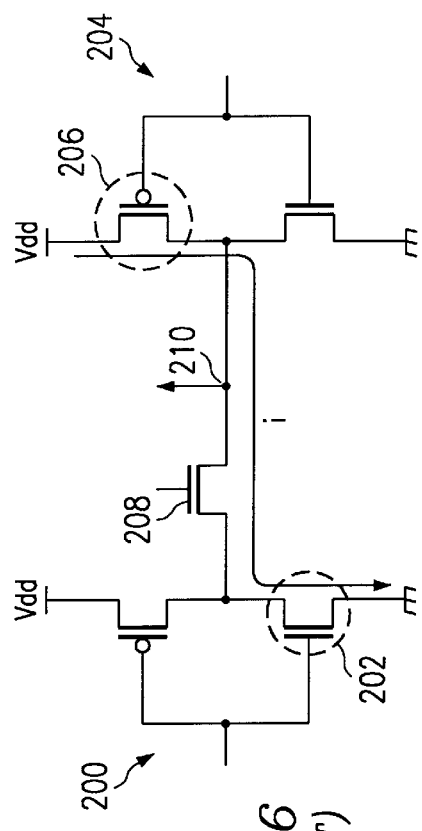
FIG. 16 is a circuit diagram illustrating the circuit configuration of a conventional ratio circuit.

FIG. 10 is a diagram illustrating an example of the circuit configuration of the 3-NMOS transistor type latch circuit in an embodiment of this invention. In the latch circuit in this embodiment, inverters 110 and 112 of the data latch circuit are made of CMOS circuits, and their P-channel MOS transistors 128 and 132 are formed as the MOS transistors for use as load element in this invention. That is, each of said P-channel MOS transistors 128 and 132 has plural, say, two, channels displaying inverse short-channel effect and connected in tandem, such as channels [CHe1, CHe2] and channels [CHf1, CHf2] for them, respectively.

Also, N-channel MOS transistor 138 of CMOS inverter 116, which functions as a driving element with respect to P-channel MOS transistor 128 of CMOS inverter 110, has single channel CHg that displays the inverse short-channel effect. Also, single type N-channel MOS transistor 118 that functions as a driving element with respect to P-channel MOS transistor 132 of CMOS inverter 112 also has single channel CHh that displays the inverse short-channel effect.

In this way, in this shift register circuit, there are two ratio circuits, that is, first ratio circuit 140, which has N-channel MOS transistor 138 of CMOS inverter 116 as the driving element and P-channel MOS transistor 128 of CMOS inverter 110 as the load element, and second ratio circuit 142, which has single N-channel MOS transistor 118 as the driving element and P-channel MOS transistor 132 of CMOS inverter 112 as the load element.

Assume transfer gates 120 and 122 are off, and the data for logic value of 1 (H level) is held in data holding node 114. In this case, in CMOS inverter 110 on one side of the data latch circuit, P-channel MOS transistor 128 is on, and N-channel MOS transistor 130 is off. Also, in CMOS inverter 112 on the other side, N-channel MOS transistor 134 is on, while P-channel MOS transistor 132 is off.

In this state, input data Din with a logical value of 1 (H level) is given to CMOS inverter 116 of the input buffer, and clock signal CK with a logical value of 1 (H level) is given to transfer gates 120 and 122.

Then, in CMOS inverter 116, P-channel MOS transistor 136 is off, and N-channel MOS transistor 138 is on. Also, transfer gate 120 also turns on. In this way, in first ratio circuit 140, electrical mismatch takes place between conducting driving-side N-channel MOS transistor 138 in and conducting load-side P-channel MOS transistor 128.

Said first ratio circuit 140 has the same configuration and operation as the ratio circuit shown in FIG. 1. Consequently, not only at normal voltage with a power source voltage Vdd of 1 V or higher, but also at low voltage near the threshold voltage of 1 V or less, the current driving ability of driving-side N-channel MOS transistor 138 is still much greater than that of load-side P-channel MOS transistor 128, and the potential at node 114 shifts to the reference potential on the driving side (ground potential Vss).

When the potential of node 114 shifts to the side of Vss, in CMOS inverter 112, N-channel MOS transistor 134 is off, and at the same time, P-channel MOS transistor 132 is on, and the potential of node 124 is at logic value 1 (H level).

In this way, in CMOS inverter 110, P-channel MOS transistor 128 is off, and at the same time, N-channel MOS transistor 130 is on, and the potential of node 114 is pulled down to Vss. In this way, data of logic value 0 (L level) is written to node 114.

For second ratio circuit 142, since driving-side N-channel MOS transistor 118 is on, the circuit is held in the disable state. Also, even when transfer gate 120 is off, the data of node 114 still can be held due to the data latch function of inverters 110 and 112.

Then, in said state, input data Din of logic value of 0 (L level) is given, and transfer gates 120 and 122 are turned on with clock signal CK.

In this case, in CMOS inverter 116, P-channel MOS transistor 136 is on and N-channel MOS transistor 138 is off. In this way, in the second ratio circuit, a voltage of logic value 1 (H level) near power source voltage Vdd is applied to the gate terminal of driving-side N-channel MOS transistor 118, and said transistor 118 is turned on. On the other hand, in this case, P-channel MOS transistor 132 of CMOS inverter 112 on the load side is also held in the on state. Consequently, both MOS transistors 118 and 132 on the driving side and load side are on, and they become electrically mismatched via transfer gate 122.

Said second ratio circuit 142 has the same configuration and operates with the same function as the ratio circuit shown in FIG. 1. Consequently, not only at a normal voltage with power source voltage Vdd of 1 V or higher, but also at a low voltage near the threshold voltage of 1 V or less, the current driving ability of driving-side N-channel MOS transistor 118 is still much greater than that of load-side P-channel MOS transistor 132, and the potential at node 124 between them shifts towards the reference potential on the driving side (ground potential Vss).

When the potential of node 124 shifts towards the side of Vss, in CMOS inverter 110, N-channel MOS transistor 130 is off, and, at the same time, P-channel MOS transistor 128 is on, and the potential of node 114 is at logic value 1 (H level). In this way, in CMOS inverter 112, P-channel MOS transistor 132 is switched to off, and at the same time, N-channel MOS transistor 134 is switched to on, and the potential of node 124 is pulled down close to Vss. In this way, data of logic value 1 (H level) is written to node 114.

Also, in first ratio circuit 140, P-channel MOS transistor 136 of CMOS inverter 116 is on, and a voltage near power source voltage Vdd is output. However, with respect to this H level, transfer gate 120 made of N-channel MOS transistor has a voltage drop corresponding to the threshold voltage. Consequently, there is little driving ability with respect to node 114. As a result, in effect, first ratio circuit 140 does not function at the low voltage.

Table 1 lists the lower limit of the power source voltage that can guarantee the operation in the latch circuit shown in FIG. 10. The data listed in Table 1 was obtained by SPICE simulation.

In Table 1, "WEAK" refers to the case when all of the MOS transistors that form the latch circuit conform to the aforementioned WEAK model; "NOMINAL" refers to the case when all of the MOS transistors conform to the aforementioned NOMINAL model; and "STRONG" refers to the case when all of the MOS transistors conform to the aforementioned STRONG model. "NSPW" refers to the case when of the MOS transistors that form the latch circuit, all of the N-channel MOS transistors fit the aforementioned STRONG model, while all of the P-channel MOS transistors fit the aforementioned WEAK model. "NWPS" refers to the opposite case: all of the N-channel MOS transistors fit the aforementioned WEAK model, while all of the P-channel MOS transistors fit the aforementioned STRONG model. These definitions are also applied in the Tables below.

TABLE 1

| Model | Temperature (° C.) | | | |
|---|---|---|---|---|
| | −40 | 0 | 25 | 125 |
| WEAK | 0.78 | 0.75 | 0.73 | 0.65 |
| NOMINAL | 0.75 | 0.72 | 0.7 | 0.64 |
| STRONG | 0.7 | 0.68 | 0.66 | 0.61 |
| NSPW | 0.69 | 0.67 | 0.65 | 0.6 |
| NWPS | 0.81 | 0.78 | 0.76 | 0.69 |

In the SPICE simulation, the following values were selected for gate length L and channel width W of MOS transistors: for N-channel MOS transistor 138, L=0.21 $\mu$m and W=0.63 $\mu$m; for N-channel MOS transistor 118, L=0.21 $\mu$m and W=0.82 $\mu$m; for N-channel MOS transistor 120, L=0.21 $\mu$m and W=1.00 $\mu$m; for N-channel MOS transistor 122, L=0.21 $\mu$m and W=0.56 $\mu$m; for N-channel MOS transistor 130, L=0.21 $\mu$m and W=0.56 $\mu$m; for N-channel MOS transistor 134, L=0.21 $\mu$m and W=0.56 $\mu$m; and for P-channel MOS transistor 136, L=0.21 $\mu$m and W=0.91 $\mu$m. For P-channel MOS transistors 128 and 132 of the load element in this invention, channels CHe1, CHe2, CHf2 and CHf3 were selected to have L=0.21 $\mu$m and W=0.28 $\mu$m; and the dimension of each intermediate region in the channel length direction was selected to be 0.28 $\mu$m.

In this SPICE simulation, at each of temperatures of 125° C., 25° C., 0° C., and −40° C., and with the frequency of clock signal CK of 20 MHz, the power source voltage Vdd was lowered gradually from 3.8 V to 0.5 V, and the power source voltage (the lower limit) at which the aforementioned latch circuit (FIG. 10) cannot perform normally was derived. The results are listed in Table 1. It can be seen that in almost all of the cases, operation can be guaranteed at a voltage lower than 0.80 V. For example, even under worst-case temperature conditions at −40° C., operation can be performed down to 0.75 V in the "MOMINAL" [sic, "NOMINAL"] mode.

Figure 11:
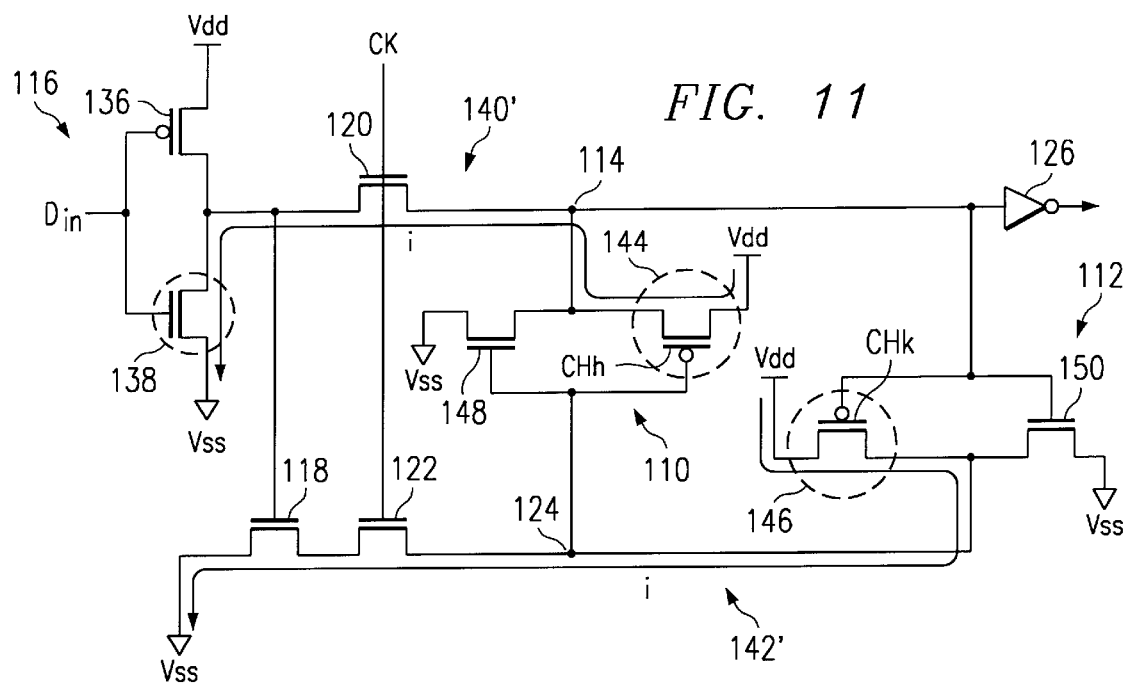
FIG. 11 is a circuit diagram illustrating the circuit configuration of the latch circuit shown in FIG. 9 using the conventional method as a comparative example.

As a reference example (comparative example), FIG. 11 illustrates the circuit configuration when the 3NMOS transistor type latch circuit shown in FIG. 9 is used. Table 2 lists the lower limit of the operation-guaranteeing voltage for the conventional circuit derived in the SPICE simulation performed in the same way as in the above.

TABLE 2

| Model | Temperature (° C.) | | | |
|---|---|---|---|---|
| | −40 | 0 | 25 | 125 |
| WEAK | 0.95 | 0.91 | 0.89 | 0.81 |
| NOMINAL | 0.92 | 0.89 | 0.87 | 0.8 |
| STRONG | 0.86 | 0.84 | 0.82 | 0.78 |
| NSPW | 0.93 | 0.85 | 0.8 | 0.73 |
| NWPS | 1 | 0.97 | 0.96 | 0.89 |

In said conventional latch circuit (FIG. 11), P-channel MOS transistors 144 and 146 of CMOS inverters 110 and 112 that form the load element in first and second ratio circuits 140' and 142' have single channels CHh and CHk, respectively. For both P-channel MOS transistors 144 and 146, gate length L and channel width W are selected as L=0.35 $\mu$m and W=0.56 $\mu$m. For N-channel MOS transistor 148 of CMOS inverter 110, the parameters are selected as L=1.03 µm and W=0.41 µm; for N-channel MOS transistor 150 of CMOS inverter 112, they are selected as L=0.21 µm and W=0.56 µm. For the other MOS transistors, the same gate length L and channel width W as those of the corresponding MOS transistors in FIG. 10 are selected.

As listed in Table 2, in the latch circuit of the comparative example (FIG. 11), usually, no operation can be performed near 0.90 V. For example, for the "MOMINAL" model under temperature condition of −40° C., 0.92 V is the limit.

In this way, by applying this invention, the operation-guaranteeing voltage for the 3-NMOS transistor type latch circuit shown in FIG. 9 can be lowered significantly, and the power consumption can be correspondingly reduced.

Figure 12:
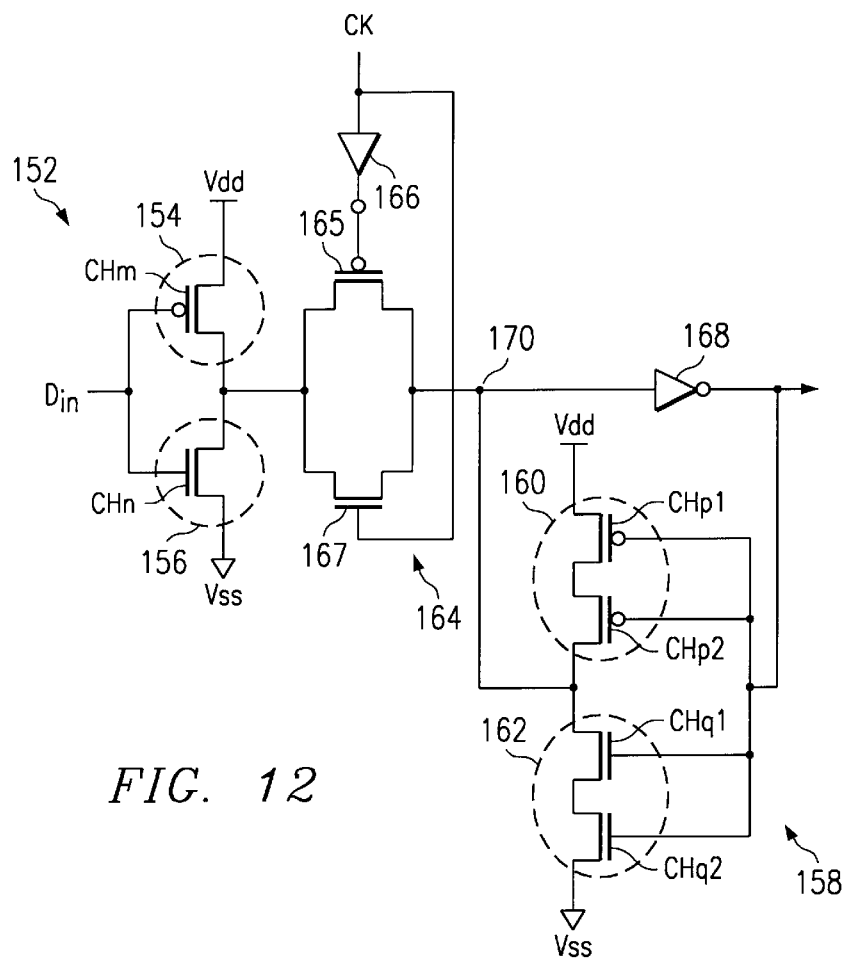
FIG. 12 is a circuit diagram illustrating the circuit configuration of the latch circuit in another embodiment of this invention.

FIG. 12 is a diagram illustrating an example of the latch circuit in another embodiment of this invention. In this latch circuit (for 1 bit), there is the second ratio circuit. In this circuit, there is the first ratio circuit, in which P-channel MOS transistor 154 of CMOS circuit 152 is the driving element and N-channel MOS transistor 162 of CMOS circuit 158 is the load element, and there is the second ratio circuit, in which N-channel MOS transistor 156 of CMOS circuit 152 is the driving element and P-channel MOS transistor 160 of CMOS circuit 158 is the load element.

Two CMOS circuits 152 and 158 are electrically connected to each other via CMOS transfer gate 164. Clock signal CK is sent through inverter 166 to CMOS transfer gate 164. The output terminal (drain terminal) of CMOS circuit 158 is connected to the input terminal of inverter 168, which also acts as an output buffer, and the output terminal of inverter 168 is connected to the input terminal (gate terminal) of CMOS circuit 158. Node 170 on the output side of CMOS circuit 158 contains 1-bit data.

According to this invention, driving-side MOS transistors 154 and 156 have single channels CHm and CHn that display the inverse short-channel effect. MOS transistors 160 and 162 on the load side have two channels [CHp1, CHp2] and [CHq1, CHq2], respectively, with each channel displaying the inverse short-channel effect and with the two channels connected in tandem.

In this latch circuit, the first ratio circuit has nearly the same configuration as that of the ratio circuit shown in FIG. 4, and performs the same operation. On the other hand, the second ratio circuit has nearly the same configuration as that of the ratio circuit shown in FIG. 1, and performs the same operation. Consequently, in this latch circuit, too, stable operation can be guaranteed not only under the conventional power source voltage, but also under a low power source voltage near the threshold voltage.

Table 3 lists the lower limit of the operation-guaranteeing voltage in the latch circuit of this embodiment (FIG. 12) derived using the same SPICE simulation as described above. For the MOS transistors, gate length L and channel width W are selected as follows. On the driving side, for P-channel MOS transistor 154, L=0.21 µm and W=0.91 µm; for N-channel MOS transistor 156, L=0.21 µm and W=0.63 µm. In CMOS transfer gate 164, for P-channel MOS transistor 165, L=0.21 µm and W=2.10 µm; for N-channel MOS transistor 167, L=0.21 µm and W=1.05 µm. On the load side, for P-channel MOS transistor 160, each of channels CHp1 and CHp2 has L=0.21 µm and W=0.28 µm, and the dimension of each intermediate region in the channel length direction is 0.28 µm.

TABLE 3

| Model | Temperature (° C.) | | | |
| --- | --- | --- | --- | --- |
|  | −40 | 0 | 25 | 125 |
| WEAK | 0.78 | 0.74 | 0.71 | 0.62 |
| NOMINAL | 0.75 | 0.72 | 0.7 | 0.61 |
| STRONG | 0.71 | 0.68 | 0.66 | 0.59 |
| NSPW | 0.71 | 0.67 | 0.65 | 0.59 |
| NWPS | 0.8 | 0.76 | 0.73 | 0.63 |

As listed in Table 3, in the latch circuit of this embodiment (FIG. 12), the operation can be guaranteed down to about 0.70 [V]. For example, even under worst-case temperature conditions at −40° C., operation can be performed down to 0.75 V in the "MOMINAL" mode. In this way, for the latch circuit in this embodiment, too, the operation-guaranteeing voltage can be lowered significantly, and the power consumption can be correspondingly reduced.

Figure 13:
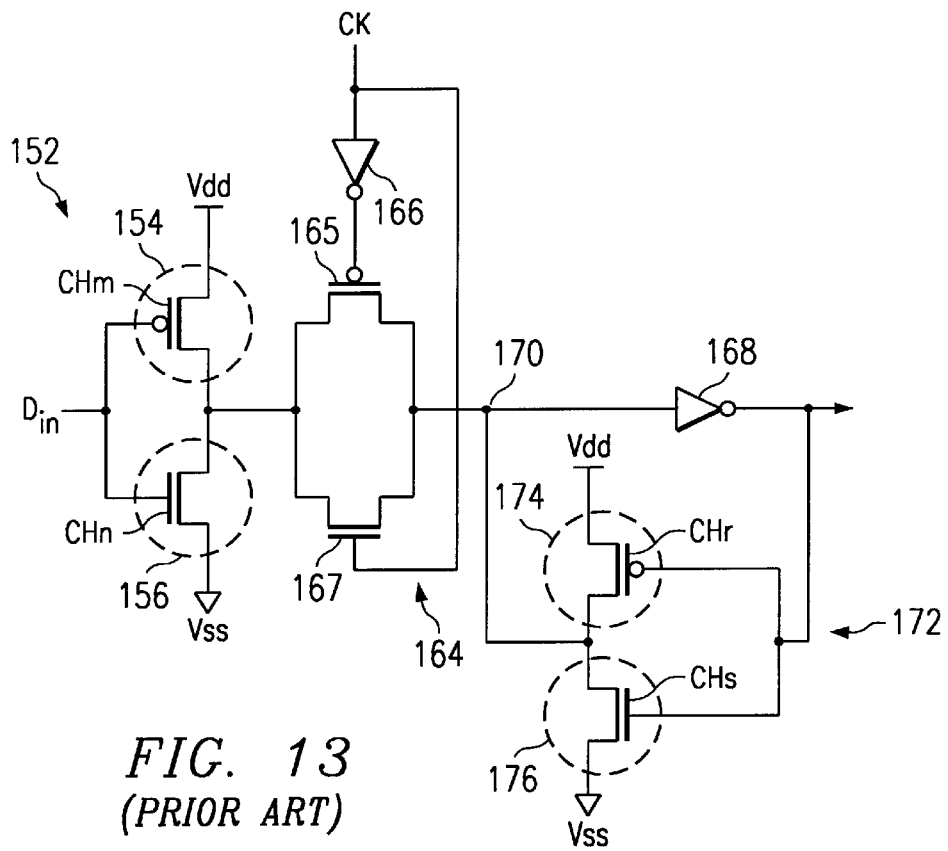
FIG. 13 is a circuit diagram illustrating the conventional circuit configuration corresponding to the latch circuit in FIG. 12.
Figure 14:
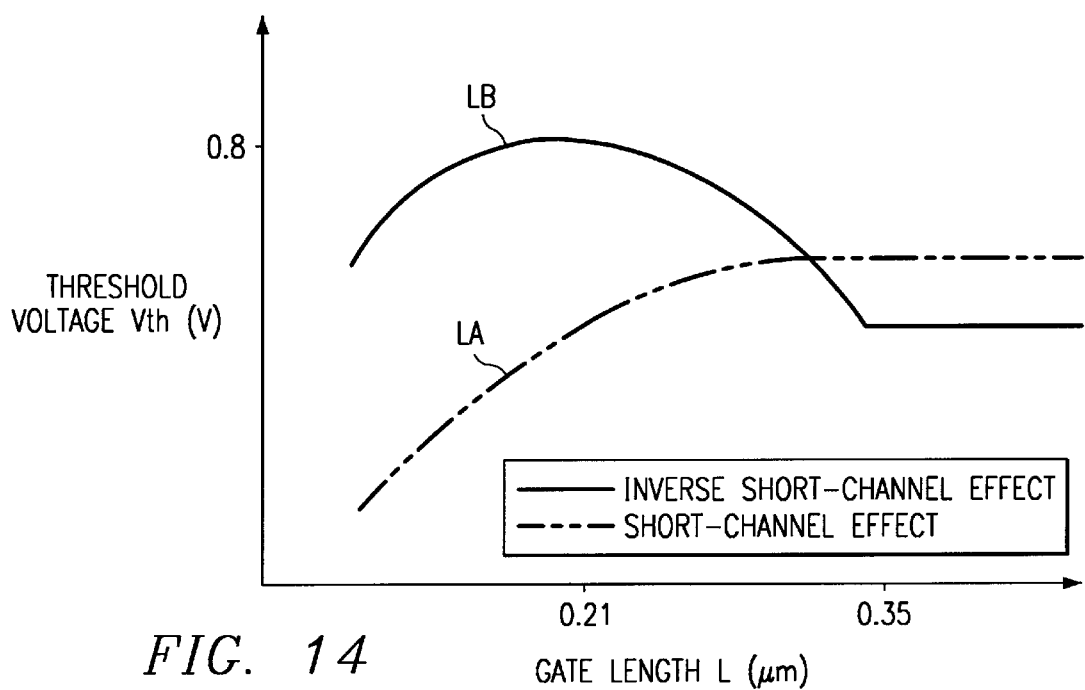
FIG. 14 is a diagram illustrating the short-channel effect and inverse short-channel effect in the MOS transistor.

As a reference example (comparative example), FIG. 13 illustrates the circuit configuration of the conventional circuit corresponding to the latch circuit in said embodiment. Table 4 lists the lower limit of the operation-guaranteeing voltage for this conventional circuit derived in the SPICE simulation performed in the same way as described above.

TABLE 4

| Model | Temperature (° C.) | | | |
| --- | --- | --- | --- | --- |
|  | −40 | 0 | 25 | 125 |
| WEAK | 0.97 | 0.87 | 0.82 | 0.7 |
| NOMINAL | 0.96 | 0.87 | 0.82 | 0.7 |
| STRONG | 0.92 | 0.83 | 0.78 | 0.58 |
| NSPW | 1.17 | 1.02 | 0.95 | 0.76 |
| NWPS | 0.9 | 0.86 | 0.83 | 0.73 |

In said conventional circuit (FIG. 13), P-channel MOS transistors (174) and (146) and N-channel MOS transistor (176) of CMOS inverter (172) on the load side each has a single channel. Gate length L and channel width W are selected as L=0.42 µm and W=0.42 µm for P-channel MOS transistor (174), and L=0.98 µm and W=0.42 µm for N-channel MOS transistor (176). Both are unaffected by the inverse short-channel effect (there is also no influence from the short-channel effect). For the other MOS transistors, the same gate length L and channel width W as those of the corresponding MOS transistors in FIG. 12 are selected.

As listed in Table 4, in the latch circuit of the comparative example (FIG. 13), the operation-guaranteeing voltage is higher in all of the cases, and the temperature characteristics are also not good. For example, for the "MOMINAL" model at a temperature of −40° C., 0.96 V is the limit.

In addition to the aforementioned latch circuit, the ratio circuit of this invention can also be applied to various types of hold circuits and shift registers, as well as data transmission circuits. The MOS transistors of this invention are not limited to the aforementioned ratio circuit and latch circuit; they may also be used in other types of circuits.

As explained above, according to this invention, it is possible to improve the guarantee on the operation of the ratio circuit in latch circuit, etc. under a low power source voltage. Also, according to this invention, it is possible to obtain a MOS transistor for which a high ON-resistance is guaranteed without substantial increase in the circuit area, and which can perform operation with the inverse short-channel effect.

What is claimed is:

1. A ratio circuit comprising a first MOS transistor which has a single channel with inverse short-channel effect and a second MOS transistor, which has plural channels, each with the inverse short-channel effect and connected in tandem, are electrically connected to each other.

2. A ratio circuit as described in claim 1 wherein at least one MOS transistor further comprises:
   a semiconductor substrate or semiconductor layer of a first conductivity type,
   a source region of the second conductivity type formed on a principal surface of said semiconductor substrate or semiconductor layer,
   a drain region of the second conductivity type formed on a principal of said semiconductor substrate or semiconductor layer,
   an intermediate region which is set between said source region and said drain region with a prescribed gap from said regions and which is formed on a principal surface of said semiconductor substrate or semiconductor layer,
   plural gate electrodes, which are formed between said source region and said intermediate region and between said drain region and said intermediate region via an insulating film on said semiconductor substrate or semiconductor layer, and which are connected to each other,
   and semiconductor regions, which are formed between said source region and said intermediate region and between said drain region and said intermediate region, respectively, on a principal surface of said semiconductor substrate or semiconductor layer to realize the inverse short-channel effect.

3. The ratio circuit described in claim 2 wherein said intermediate regions are formed between said source region and said drain region with a prescribed gap; in the portion between each pair of adjacent intermediate regions, said gate electrode is formed via an insulating film on said semiconductor substrate or semiconductor layer, and, at the same time, said semiconductor region for realizing the inverse short-channel effect is formed on a principal surface of said semiconductor substrate or semiconductor layer.

4. The ratio circuit described in claim 3 wherein said semiconductor regions are formed near the end portions of said source region, said drain region, and said intermediate region near the end portions of said gate electrodes, respectively.

5. The ratio circuit described in claim 4 wherein said semiconductor region has a first region of the second conductivity type, which has an impurity concentration different from that of said source region, said drain region and said intermediate region and which is set in contact with the said insulating film, and a second region, which has an impurity concentration different from that of said semiconductor substrate or semiconductor layer and which is formed in contact with said first region and below it.

6. A ratio circuit comprising:
   a first MOS transistor of a first conductivity type, which has a single channel with inverse short-channel effect and which has its source terminal connected to a first reference voltage terminal that supplies the first potential, and
   a second MOS transistor of the second conductivity type which has plural channels, each with the inverse short-channel effect and connected in tandem, and which has its source terminal connected to a second reference voltage terminal that supplies a second potential different from said first potential and has its drain terminal electrically connected to the drain terminal of said first MOS transistor.

* * * * *